United States Patent
Kagaya et al.

(10) Patent No.: US 7,011,458 B2
(45) Date of Patent: Mar. 14, 2006

(54) OPTICAL MODULE

(75) Inventors: Osamu Kagaya, Tokyo (JP); Seiji Sumi, Yokohama (JP); Hiroyuki Arima, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/131,177

(22) Filed: May 18, 2005

(65) Prior Publication Data
US 2006/0008194 A1    Jan. 12, 2006

(30) Foreign Application Priority Data
Jul. 12, 2004  (JP) ............................ 2004-204143
Nov. 1, 2004   (JP) ............................ 2004-317752

(51) Int. Cl.
G02B 6/42    (2006.01)
G02F 1/03    (2006.01)

(52) U.S. Cl. ..................... 385/92; 385/88; 359/245; 359/237

(58) Field of Classification Search .............. None
See application file for complete search history.

(56) References Cited

U.S. PATENT DOCUMENTS 6,075,954 A * 6/2000 Ogata et al. ................ 399/60
6,323,986 B1 * 11/2001 Lee et al. .................. 359/245
6,687,039 B1 * 2/2004 Shirai ....................... 359/237
6,831,767 B1 * 12/2004 Shigeta et al. ............. 359/245
2005/0146766 A1 * 7/2005 Kato ......................... 359/237

FOREIGN PATENT DOCUMENTS

JP    2001-257412    9/2001
JP    2001-308130    11/2001

OTHER PUBLICATIONS

"ASIP 1310 nm EML TOSA", Jul. 2004.

* cited by examiner

Primary Examiner—Rodney Bovenick
Assistant Examiner—Omar Rojas
(74) Attorney, Agent, or Firm—Mattingly, Stanger, Malur & Brundidge, P.C.

(57) ABSTRACT

An optical module having: a first transmission line and a second transmission line, both connected in series to transmit electrical signals; a laser diode element; an optical modulator element; a termination resistance element for impedance matching; a first bonding wire connecting one end of the first transmission line and the optical modulator element; and a second bonding wire connecting the optical modulator element and the termination resistance element. The resistance value of the termination resistance element is set to stay in a range from 40 to 60 Ω, the characteristic impedance of the second transmission line is set to 50 Ω, and the characteristic impedance of the first transmission line is set to stay in a range from 20 to 30 Ω.

15 Claims, 11 Drawing Sheets

50-Ω INPUT LINE

FIG. 5B

50-Ω LINE + 30-Ω LINE

OPTICAL MODULE

CROSS-REFERENCES TO RELATED APPLICATIONS

This application relates to Japanese patent application serial no. 2004-204143, filed on Jul. 12, 2004, entitled "Optical Module", the content of which is incorporated herein by reference.

CLAIM OF PRIORITY

The present application claims priority from Japanese patent application serial no. 2004-317752, filed on Nov. 1, 2004, the content of which is hereby incorporated by reference into this application.

BACKGROUND OF THE INVENTION

The present invention relates to optical modules for optical communications, and more particularly, to an optical module used in the transmitting section of an optical transmitter operating at high transmission rates.

The optical transmission modules using a semiconductor laser are one of the key devices in transceivers for optical-fiber transmission. Along with the proliferation of broadband networks in recent years, optical transmission modules have been speeded up and types up to 10 Gbits/s in bit rate are coming to be most commonly used. Optical transmission modules suitable for the above applications are required to be more compact and less expensive as well as to achieve higher transmission waveform quality.

Japanese Patent Laid-open Nos. 2001-257412 and 2001-308130 describe the modules that simultaneously ensure both reduction in small-signal reflection coefficient (S11) with respect to a radiofrequency input characteristic impedance of 50 Ω (ohms) and the retention of a 3-dB band in the small-signal passage characteristics (S21) of the optical modulator of an electroabsorption optical modulator integrated laser diode. The above modules are realized by properly conditioning the relationship in inductance between a first bonding wire for connecting the modulator and signal line of the modulator, and a second boding wire for connecting the modulator and a matching resistor.

Also, the "ASIP 1310 nm EML TOSA", a pamphlet of ASIP Inc., lists electroabsorption optical modulator integrated laser modules that each contain a CAN-type package(s) with a driving impedance of 50 Ω and a termination resistance of 100 Ω.

To further improve transmission waveform quality of an optical transmission module, it is necessary not only to ensure the retention of a 3-dB band in the small-signal passage characteristics (S21) of the optical modulator, but also to optimize the small-signal passage characteristics (S21) by adjusting the peaking characteristics of S21 to spread transmission waveform mask margins relative to ITU-T provisions.

According to studies by the inventors, for optical module driving with an ideal 50-Ω signal source (e.g., measuring-pulse pattern generator), it has been within a sufficiently possible range to optimize the small-signal passage characteristics (S21) in Japanese Patent Laid-open No. 2001-257412 and spread transmission waveform mask margins, by properly conditioning the relationship in inductance between the first bonding wire and the second boding wire for connecting the modulator and the matching resistor. The optimization, however, prevents the small-signal reflection coefficient (S11) from being sufficiently reduced, thus resulting in an impedance mismatch.

For driving ICs currently available in the market, especially for long-distance transmission applications, a bias voltage signal of nearly 1 V and a driving signal with a large voltage amplitude of 2 Vpp or more are required as the driving signals for an optical modulator. Accordingly, output impedance usually departs from 50 Ω during IC operation. In that case, an impedance mismatch occurs across the 50-Ω transmission line connecting the driving IC and the optical modulator. Therefore, a multipath reflection voltage is superimposed on the driving voltage signals and the output waveforms of the optical modulator become disturbed. As a result, transmission waveform mask margins deteriorate.

One of the methods available to solve the above problem is by building the driving IC into an optical transmission module. In this case, the effects of multipath reflection can be suppressed for better transmission waveforms by minimizing the length of the 50-Ω transmission line connecting the driving IC and the optical modulator. However, since the driving IC requires a large number of control terminals and power supply terminals, another problem arises from building the driving IC into an optical transmission module. That is to say, compared with the number of terminals under a non-built-in condition of the driving IC, the number of terminals in the optical transmission module with the driving IC built therein increases, which makes dimensional reduction of the module difficult.

SUMMARY OF THE INVENTION

A point of the present invention exists in an optical module that includes a first transmission line for transmitting an electrical signal to a second transmission line, an optical modulator element connecting to the second transmission line in order to modulate laser light using the electric signal, and a termination resistance element connecting with both the second transmission-line and the termination resistance element; wherein a difference between a resistance value of the termination resistance element and a characteristic impedance of the second transmission line is reduced to a maximum of 10 Ω, and a characteristic impedance of the first transmission line is reduced by at least 20 Ω below the characteristic impedance of the second transmission line.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Preferred embodiments of the present invention will now be described with reference to the drawings. The same reference number or symbol is assigned to each of the same sections in each drawing, and description of these sections is omitted.

Figure 1:
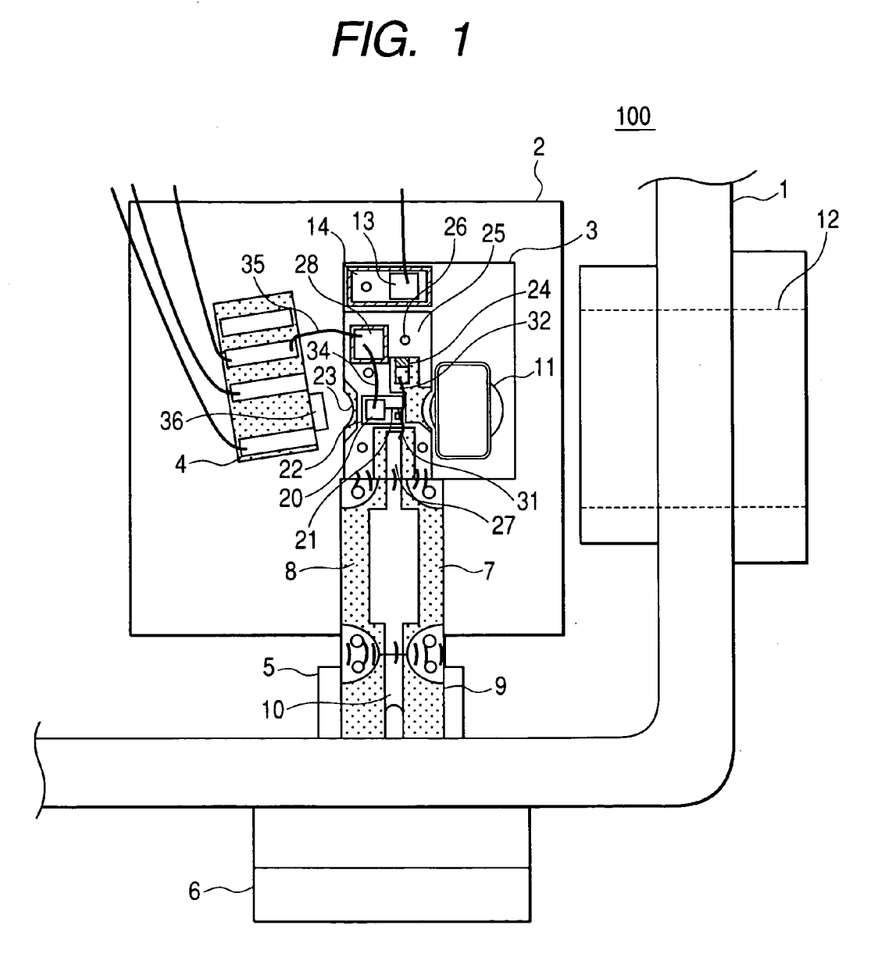
FIG. 1 is a structural view showing major sections of an optical transmission module according to a first embodiment of the present invention.
Figure 2:
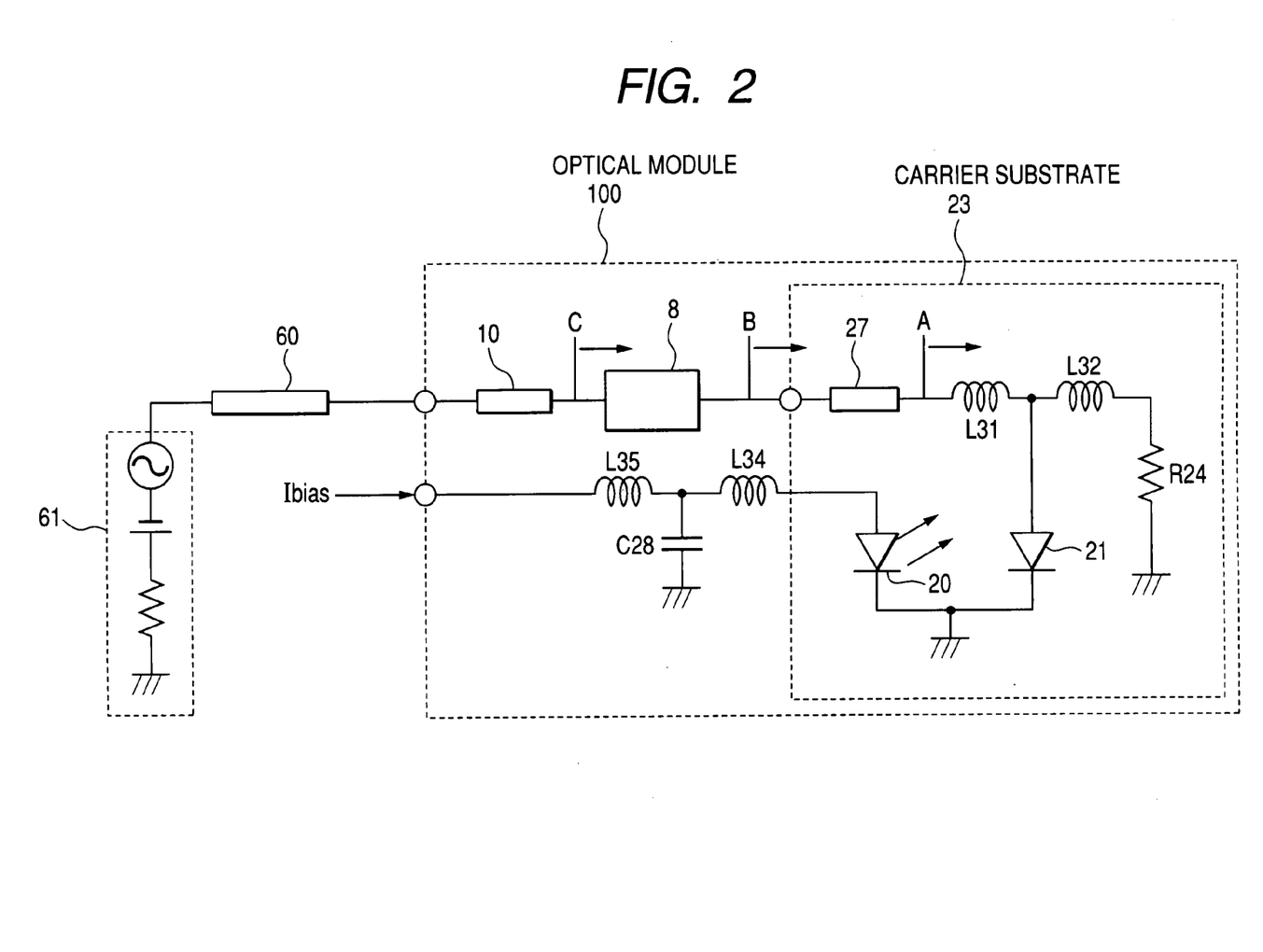
FIG. 2 is a main circuit diagram of the optical transmission module according to the first embodiment of the present invention.
Figure 3:
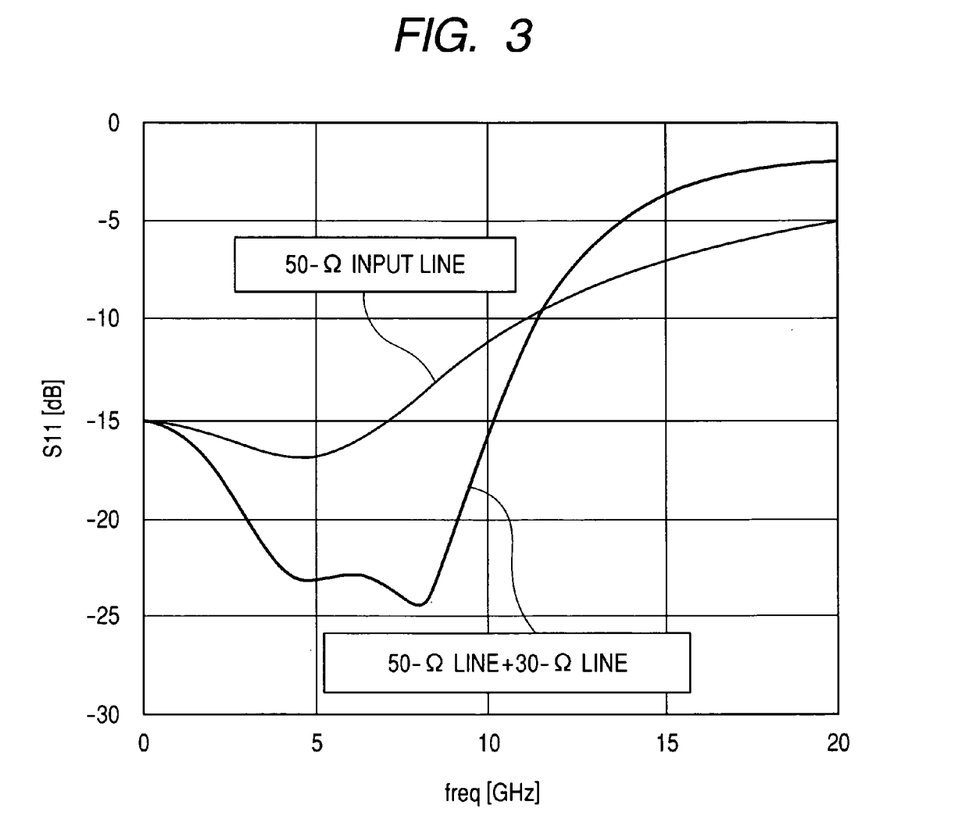
FIG. 3 is an explanatory diagram of the first embodiment of the present invention, showing the relationship between frequencies and input reflection coefficient S11 of the optical transmission module.
Figure 4:
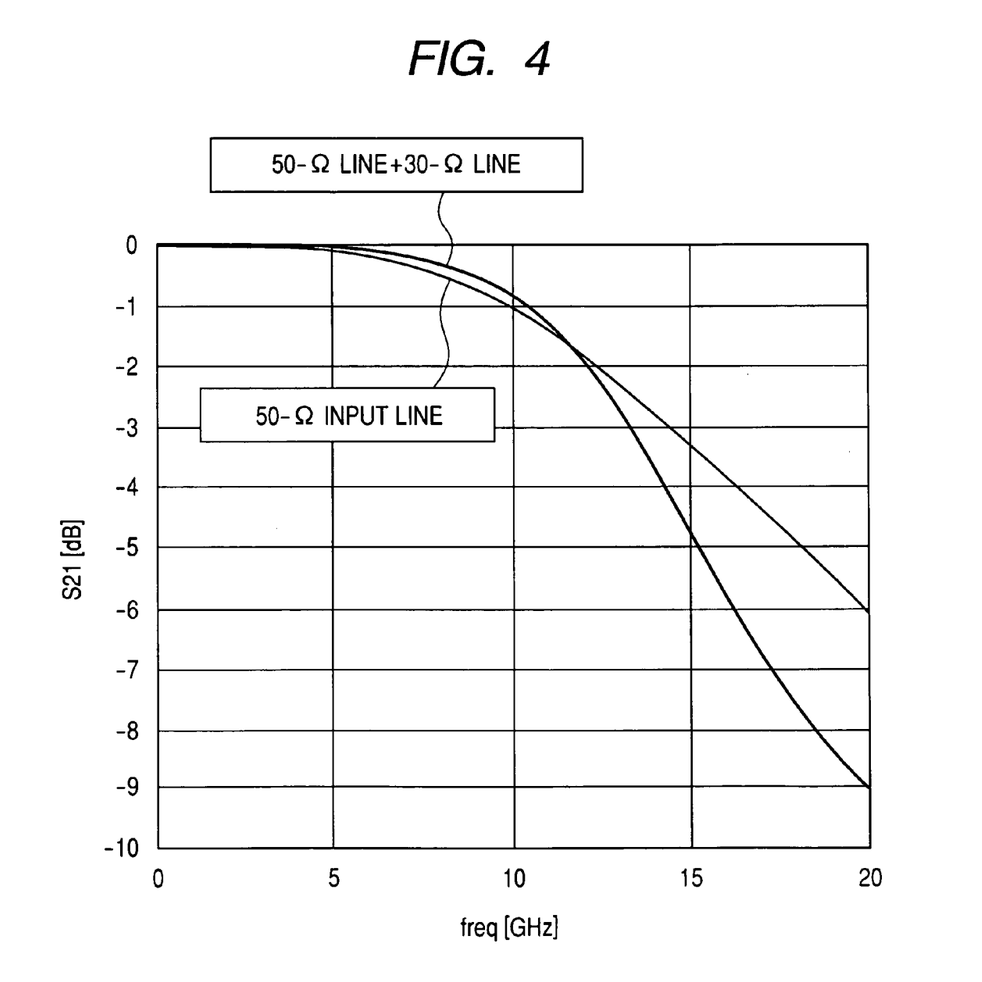
FIG. 4 is an explanatory diagram of the first embodiment of the present invention, showing the relationship between frequencies and electro-optical signal passage characteristics S21 of the optical transmission module.
Figure 5A:
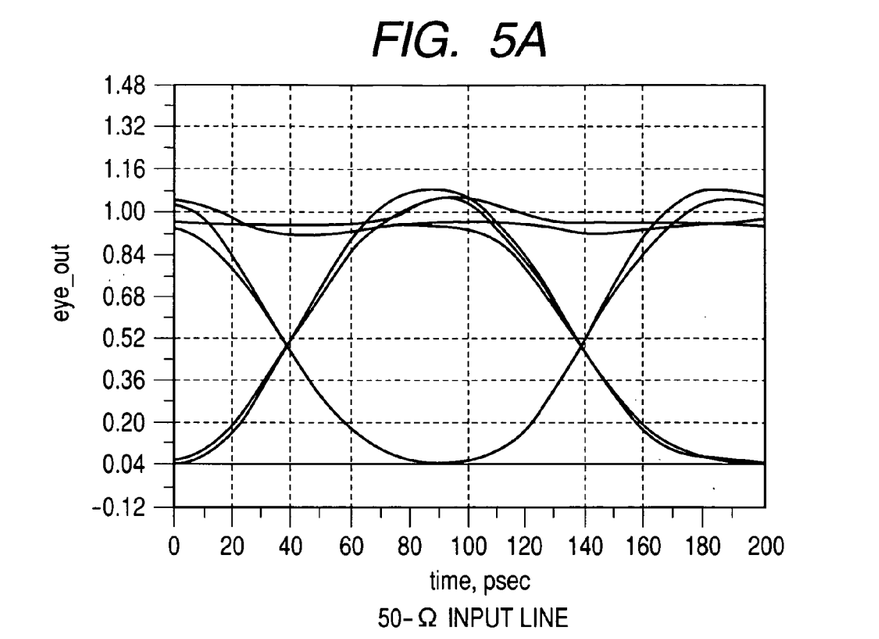
FIGS. 5A, 5B are optical output waveform diagrams explaining an advantageous effect of the first embodiment of the present invention.
Figure 5B:
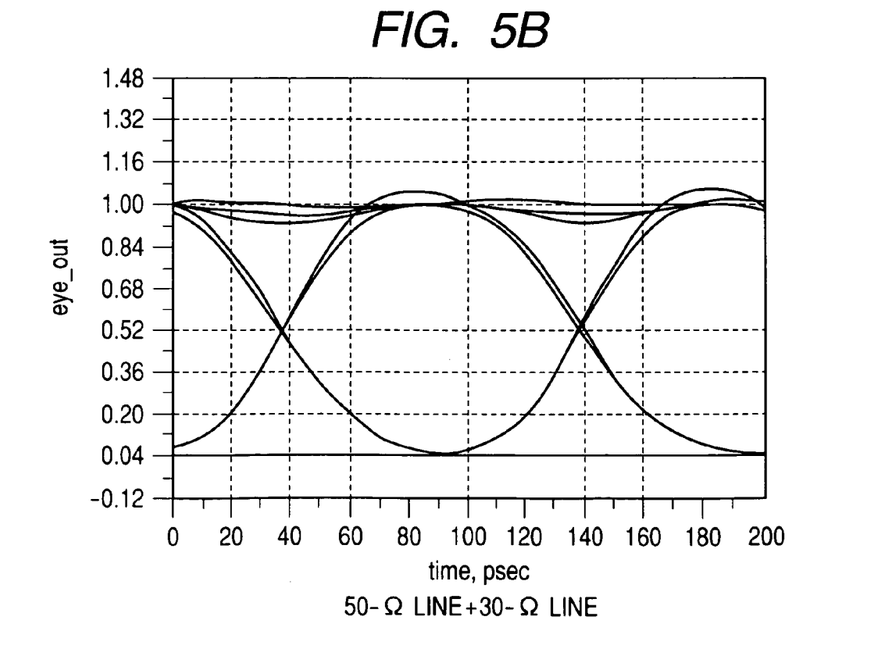
Figure 6:
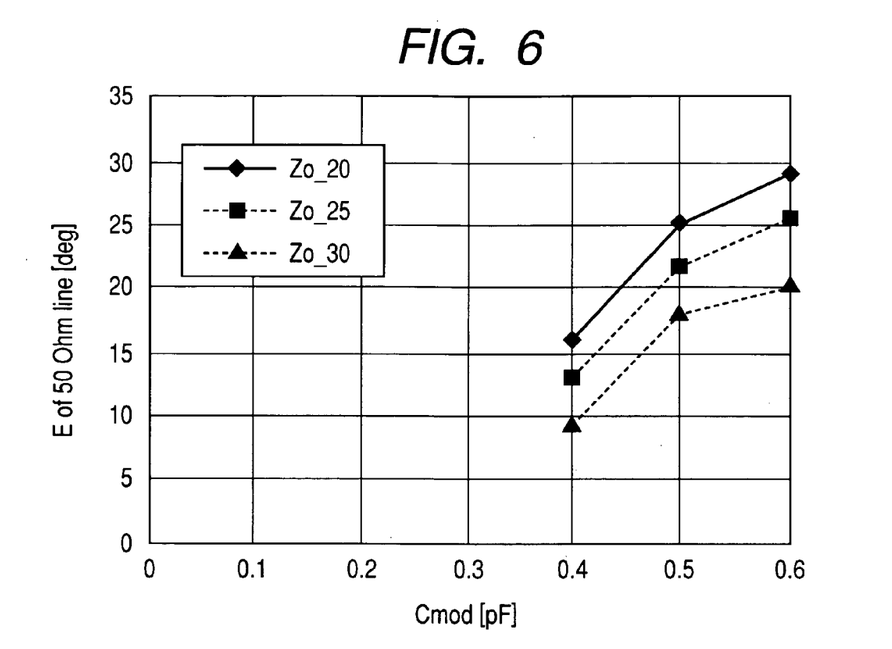
FIG. 6 is a graph explaining another advantageous effect of the first embodiment of the present invention.
Figure 7:
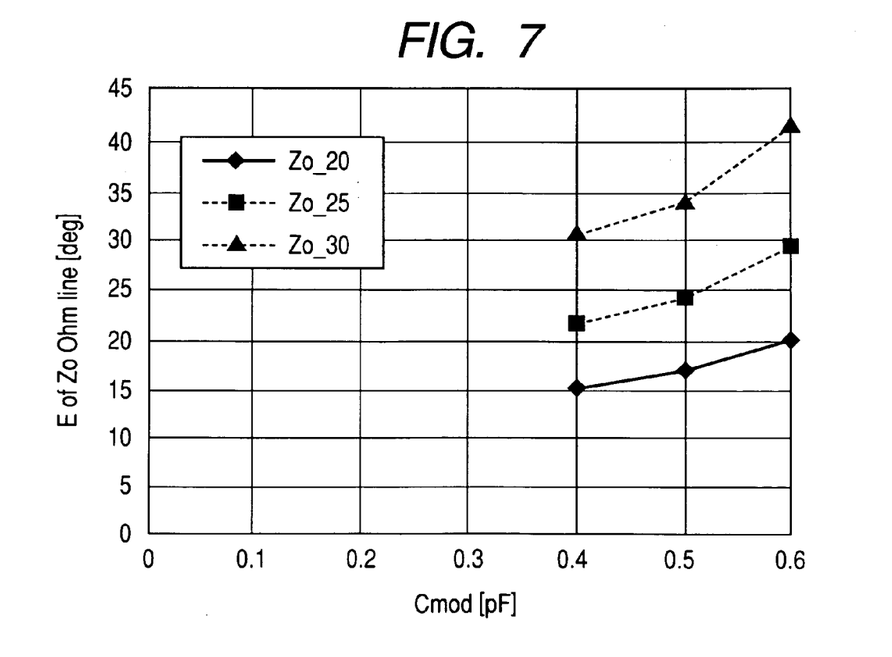
FIG. 7 is another graph explaining an advantageous effect of the first embodiment of the present invention.
Figure 8:
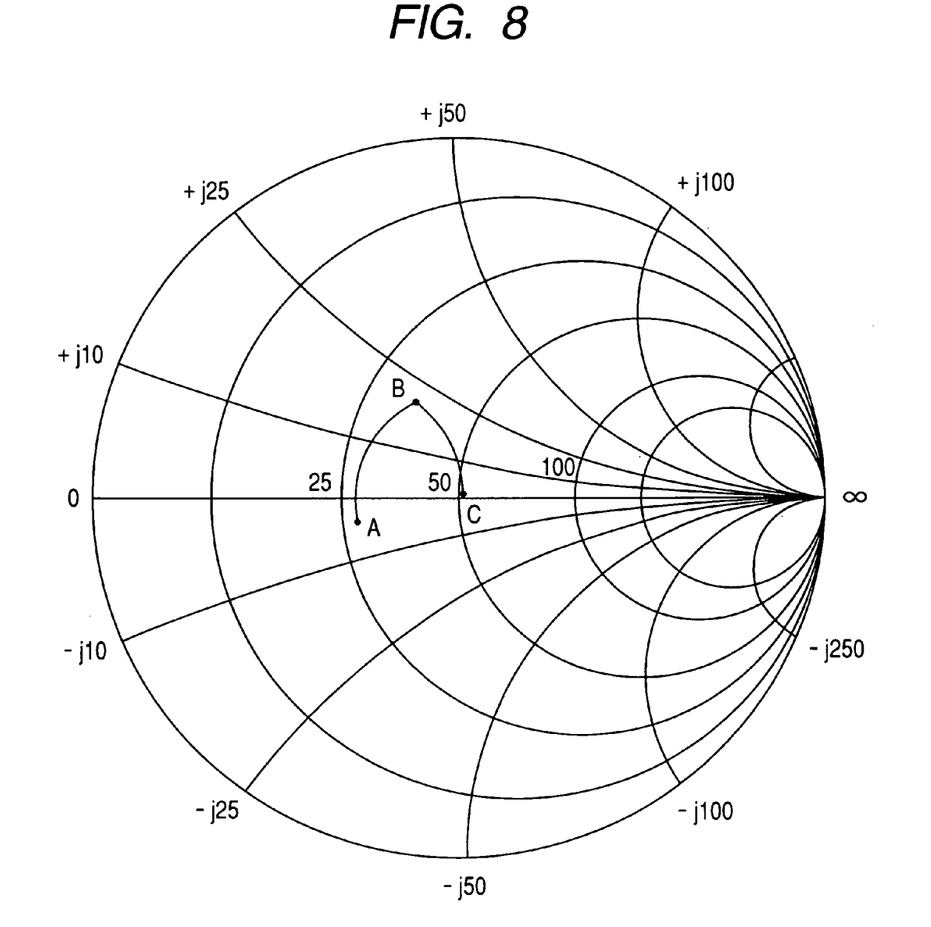
FIG. 8 is a Smith chart explaining an advantageous effect of the first embodiment of the present invention.

A first embodiment of the present invention will be described below using FIGS. 1 to 8. FIG. 1 is a plan view showing major sections of an optical transmission module according to the first embodiment of the present invention. FIG. 2 is a main circuit diagram of the optical transmission module according to the first embodiment of the present invention. FIG. 3 is an explanatory diagram of the first embodiment of the present invention, showing the relationship between frequencies and input reflection coefficient S11 of the optical module. FIG. 4 is another explanatory diagram of the first embodiment of the present invention, showing frequencies and electro-optical signal passage characteristics S21 of the optical module. FIGS. 5A, 5B are optical output waveform diagrams explaining an advantageous effect of the first embodiment of the present invention. FIGS. 6 and 7 are diagrams explaining the relationship between a capacity of a modulator and an electrical length of a different transmission line, plotted for a characteristic impedance of the transmission line as a parameter. FIG. 8 is a Smith chart explaining the first embodiment of the present invention.

First, a configuration of a optical transmission module will be described using FIG. 1. The optical transmission module 100 uses a box type of package as its enclosure 1. On one lateral face of the enclosure 1, a coaxial connector 6 is provided as an input terminal for electrical signals. An internal conductor of the coaxial connector 6 connects with a transmission line 10 on a connection substrate 9 provided inside the enclosure. A substrate support portion 5 fixes the connection substrate 9. The substrate support portion 5 electrically connects an external conductor of the coaxial connector 6 and a grounding conductor of the transmission line 10 at the same time. On an inner bottom face of the enclosure 1 is fixed a Peltier element 2, on which a relay substrate 7, a monitoring photodiode mounting substrate 4, and a metallic mount 3 are mounted. A transmission line 8 having a characteristic impedance lower than that of any other transmission line is provided on the relay substrate 7. The transmission line 8 is of the microstrip line type that facilitates extension of pattern width and is preferred for impedance reduction. A monitoring photodiode 36 is provided on the monitoring photodiode mounting substrate 4 and fixed to a position at which the photodiode can receive the light output from rear facet of a semiconductor laser diode element 20. A carrier substrate 23, a coupling lens 11, and a thermistor-mounting substrate 14 are mounted on the metallic mount 3. The mounting—mounting substrate 14 has a mounting 13 mounted thereon to monitor a surface temperature of the Peltier element 2.

A semiconductor chip 22 and a bypass capacitor 28 are mounted on the carrier substrate 23. Patterns of a resistance element 24, a grounding metal 25, and an input transmission line 27, are also provided on the carrier substrate 23. The grounding metal 25 connects with a reverse-side electrode of the carrier substrate 23 through a VIA hole 26. The semiconductor chip 22 is a modulator-integrated semiconductor laser chip having, on its surface, a semiconductor laser diode element 20 and an optical modulator element 21. The continuous laser light output from the semiconductor laser diode element 20 is passed through the optical modulator element 21 and then emitted to an optical fiber via a coupling lens 11 and an enclosure light-exit portion 12. The modulator element 21 modulates the continuous laser light into optical modulation signals using the 10-Gbits/s electrical modulation signals sent from an external driving IC.

A first bonding wire 31 connects the input transmission line 27 and the optical modulator element 21. A second bonding wire 32 connects the optical modulator element 21 to the resistance element 24. The input transmission line 27 on the carrier substrate 23 and the transmission line on the relay substrate 7 are connected by a ribbon wire or the like at low inductance. The transmission line on the relay substrate 7 and the transmission line 10 on the connection substrate 9 are also connected by a ribbon wire or the like at low inductance. In addition, the connection substrate 9, the relay substrate 7, and the carrier substrate 23 have respective reverse-side wiring routed out to a surface layer through a VIA hole and connected to one another by a ribbon wire or the like. In this way, an electric signal input route from the coaxial connector 6 to the optical modulator element 21 is constructed. The semiconductor laser diode element 20 connects with external terminals (not shown) via power-feeding bonding wires 34, 35, and supplies a DC current from the external terminals. The power-feeding bonding wires 34, 35 connect with each other on an electrode of the bypass capacitor 28.

The box-type package enclosure 1 is constructed of a ceramic material and a metal, thus ensuring airtightness. Use of a highly heat-conductive copper-tungsten alloy as a material for the bottom of the package enclosure 1 is preferred for reducing electric power consumption in the Peltier element 2, since that material reduces the thermal resistance transmitted from the Peltier element 2 to the outside of the optical transmission module. The relay substrate 7 and the carrier substrate 23 are constructed of a dielectric material such as alumina or aluminum nitride. If the carrier substrate 23 and the metallic mount 3 are constructed of highly heat-conductive aluminum nitride and a copper-tungsten alloy, respectively, the construction is preferred for suppressing increases in element temperature, since it lowers the thermal resistance transmitted from the semiconductor chip 22 to the Peltier element 2. The resistance element 24 is constructed of a tantalum nitride film surface-treated by anodic oxidation, and is adjusted by laser trimming to obtain a resistance value of 50 Ω.

The semiconductor chip 22 uses an "n"-type InP substrate, on the surface of which are formed the semiconductor laser diode element 20 that is a distributed feedback laser diode (DFB-LD), and the optical modulator element 21 that is an electroabsorption modulator (EAM). Respective anodic electrodes of the semiconductor laser diode element 20 and the optical modulator element 21 are also provided on the chip surface. If the first bonding wire 31 and the second bonding wire 32 are linearly formed by interposing one wire between both with the anodic electrode of the optical modulator element 21 as a relay point, the formation is preferred for reduction in element capacity Cmod, since the anodic electrode of the optical modulator element 21 can be minimized in area. The reverse-side electrode of the chip is used as a cathodic electrode shared by the semiconductor laser diode element 20 and the optical modulator element 21. An output from the monitoring photodiode 32 is sent out through an external terminal (not shown). For dimensional reduction, it is preferable that the bypass capacitor 28 be of the parallel flat-plate type constructed as a single-layer, highly dielectric substrate.

Next, circuit composition will be described using FIG. 2. First, an electrical modulation signal that an external driving IC 61 has output is input to the input transmission line 27 on the carrier substrate through an external transmission line 60, the transmission line 10 on the connection substrate, and the transmission line 8 on the relay substrate. The transmission line 60 includes a transmission line formed on a printed substrate having the driving IC 61 mounted thereon, a coaxial cable connecting from the transmission line on the printed substrate to the coaxial connector 6, and the coaxial connector 6. The transmission line 60 assumes a characteristic impedance of 50 Ω. Also, the transmission line 10 and input transmission line 27 each assumes a characteristic impedance of 50 Ω, and the transmission line 8 assumes a characteristic impedance of 30 Ω. Symbol R24 denotes a resistance value of the resistance element 24, and symbols L31, L32 denote inductance values of the first and second bonding wires 31, 32, respectively. The transmission line 8 is shown with a very large width since this line has impedance lower than those of other transmission lines.

The electrical modulation signal is input to an anode of the optical modulator element 21 via the above circuit elements. A cathode of the optical modulator element 21 is electrically grounded. A forward DC current Ibias is supplied as a bias current from an external circuit element to the semiconductor laser diode element 20, which then outputs laser light. Symbols L34, L35 in FIG. 2 denote inductance values of the power-feeding bonding wires 34, 35, respectively, and symbol C28 denotes a capacity of the bypass capacitor 28. Since an inverse bias is usually applied to the electroabsorption modulator to operate it, the present embodiment uses both a negative power supply voltage of, e.g., −5.2 V, and a positive power supply voltage of, e.g., +3.3 V for the laser element.

In the present embodiment, for example, Cmod is 0.5 pF, L31 is 0.29 nH, L32 is 0.75 nH, and R24 is 50 Ω. Also, electrical lengths of the input transmission line 27 (50 Ω in characteristic impedance) and of the transmission line 8 (30 Ω in characteristic impedance) at a 10-GHz frequency are taken as 35.0 degrees and 31.3 degrees, respectively. Electrical length is a dimension of length for an effective resonance line length of 360 degrees. The characteristics of each transmission line can be defined using impedance (Z), electrical length (E), and frequency (f).

Next, characteristics of the optical transmission module according to the present embodiment will be described using FIGS. 3 to 5. These characteristics are derived from calculations using a circuit simulator.

As shown in FIG. 3, the radiofrequency input side described in Japanese Patent Laid-open No. 2001-257412 or 2001-308130 is constructed with a characteristic impedance of 50 Ω. That is, the characteristic impedances of all transmission lines at the input side are unified to 50 Ω. This causes deterioration since reflection coefficient S11 increases over −15 dB in a frequency range of 7.5 GHz and more. However, if a transmission line 27 of about 50 Ω and a transmission line 8 of about 30 Ω are inserted near the optical modulator, the reflection coefficient S11 is reduced (improved) in a wide frequency range from 0 (DC) to 12 GHz. This is indicative of the effect that suppresses the reflection coefficient to at least −15 dB in the frequency range from 0 (DC) to 10 GHz. In particular in the neighborhood of 7.5 GHz, the effect is obtained that suppresses the reflection coefficient to −20 dB or less. In addition, as shown in FIG. 4, sufficient small-signal passage characteristics S21 are exhibited, and insertion of a 30-Ω line yields a slight gain improvement in the frequency range from 0 (DC) to 12 GHz.

FIGS. 5A, 5B show the optical output waveforms obtained during operation of the optical transmission module at 10 Gbits/s. FIG. 5A is for the 50-Ω input line, and FIG. 5B applies when the 30-Ω line is added to the 50-Ω input line. These figures represent the eye-patterns observed after signal passage through a 7.5-GHz Bessel filter. The output impedance of the driving IC is 75 Ω, which is a significant departure from 50 Ω. Accordingly, if the radiofrequency input side is constructed using the 50-Ω transmission line only, the influence of multipath reflection deteriorates waveform quality. In the present embodiment with inserted 30-Ω transmission line 8 and 50-Ω transmission line 27, however, multipath reflection is suppressed and high waveform quality is obtained.

The way the effect of suppressing reflection coefficient S11 by inserting the transmission line 8 to the transmission line 27 is yielded will be next described. When the optical modulator element 21 is connected to the inductances of L31, L32, and the resistance element with a resistance of R24 is grounded, as shown in FIG. 2, small-signal passage characteristics (S21) favorable for 50-Ω driving can be realized by, for example, assigning 0.29 nH to L31, 0.75 nH to L32, and 50 Ω to R24, for 10-Gbits/s optical communications. An element ranging from 0.4 to 0.6 pF in element capacity Cmod is most commonly used as the optical modulator element 21. In addition, the 3-dB band in the small-signal passage characteristics can be obtained at 10 GHz or more by taking the above connection form. According to measurements by the present inventors, after laser light of desired intensity has been input to the optical modulator element 21 following completion of the above connection, a parallel conductance of about 100 Ω due to a photocurrent occurs in the optical modulator element 21. Also, in FIG. 2, a real portion and imaginary portion of the impedance expected to be applied from a signal input end (arrow A) of L31, toward the modulator, take values of 24–37 Ω and 1–5 Ω, respectively, at 7.5 GHz. These values slightly change with the values of L31, L32. Impedance conversion into a matching point of 0 Ω is possible by using two elements, namely, a 50-Ω transmission line relatively small in electrical length and a 20-Ω to 30-Ω transmission line relatively small in electrical length, in a range of λg/4 (90 degrees in electrical length) or less at a 7.5-GHz frequency, i.e., in respective electrical length ranges of 120 degrees or less at a 10-GHz frequency. A minimum difference in impedance between both transmission lines in that case is preferably 20 Ω or more.

The electrical lengths of the 50-Ω transmission line 27 and transmission line 8 (20–30 Ω) that are needed to obtain complete matching conditions at 7.5 GHz are shown in FIGS. 6 and 7, respectively. FIGS. 6, 7 show simulation results on the relationship between the modulator element capacity and the necessary electrical length, plotted for a characteristic impedance of the low-impedance transmission line 8 as a parameter.

In an element capacity range from 0.4 to 0.6 pF, it can be seen from FIG. 6 that the electrical length of the 50-Ω transmission line 27 at a frequency of 10 GHz needs to be at least 10 degrees, and it can be seen from FIG. 7 that the electrical length of the transmission line 8 at the 10-GHz frequency needs to be at least 15 degrees. Additionally, it is possible, by selecting, as the electrical lengths of the transmission lines 27 and 8, values slightly greater than the electrical lengths in the relationship shown in FIG. 6 or 7, to implement band broadening with gentle matching, although slight departures from the complete matching conditions at 7.5 GHz arise. At the same time, S11 can be improved in a relatively wide range with 7.5 GHz as its center. In the present first embodiment, the effect that suppresses the reflection coefficient to −15 dB or less in a wide frequency range from 0 (DC) to 10 GHz can be obtained by assigning 35 degrees and 31.3 degrees to the electrical lengths of the transmission line 27 (50 Ω in characteristic impedance) and transmission line 8 (30 Ω in characteristic impedance), respectively.

Next, impedance in a Smith chart of FIG. 8 will be described with reference to FIG. 2. The impedance expected to be applied from arrow A in FIG. 2, toward the optical modulator element 21, is shown as A in FIG. 8. The impedance expected to be applied from arrow B in FIG. 2, toward the modulator, is equivalent to an electrical length of 35 degrees in the 50-Ω transmission line. This impedance, therefore, becomes value B of FIG. 8, this value being obtained by rotating a radius up to portion A with a 50-Ω actual axis of the Smith chart as a center, through 35 degrees clockwise. Also, the impedance expected to be applied from arrow C in FIG. 2, toward the modulator, is equivalent to an electrical length of 31.1 degrees in the 30-Ω transmission line. This impedance, therefore, becomes value C of FIG. 8, this value being obtained by clockwise rotation through 31.3 degrees around a 30-Ω actual axis of the Smith chart. The assumption that as mentioned above, the electrical lengths of the transmission lines are in a range of λ/4 (90 degrees in electrical length) or less at a 7.5-GHz frequency is due to the fact that since one revolution of the Smith rotation is equivalent to 180 degrees, the total transmission line length of the two elements does not need to be defined as 180 degrees or more.

While the above first embodiment assumes that the resistance element 24 has a resistance value of 50 Ω, this value may range from 40 to 60 Ω, depending on factors such as adaptability to the driving IC mounted in an optical transmitter. Also, while it is assumed that the transmission line 8 has a characteristic impedance of 30 Ω, this value may be changed in a range of 20–30 Ω. In addition, while it is assumed that the transmission line 27 has a characteristic impedance of 50 Ω, this value may be changed in a range of 40–60 Ω. In this case, if the difference from the characteristic impedance of the transmission line 8 is adjusted to at least 20 Ω, this is preferred for obtaining a reduction in input reflection coefficient.

Furthermore, a diode polarity of the optical modulator element 21 in the circuit composition (FIG. 2) of the present embodiment may be reversed. This makes it possible, even with a positive power supply, to apply an inverse bias to the optical modulator element 21, and hence to realize an optical transmission module that can operate only on positive power such as +5.0-V power.

Figure 9:
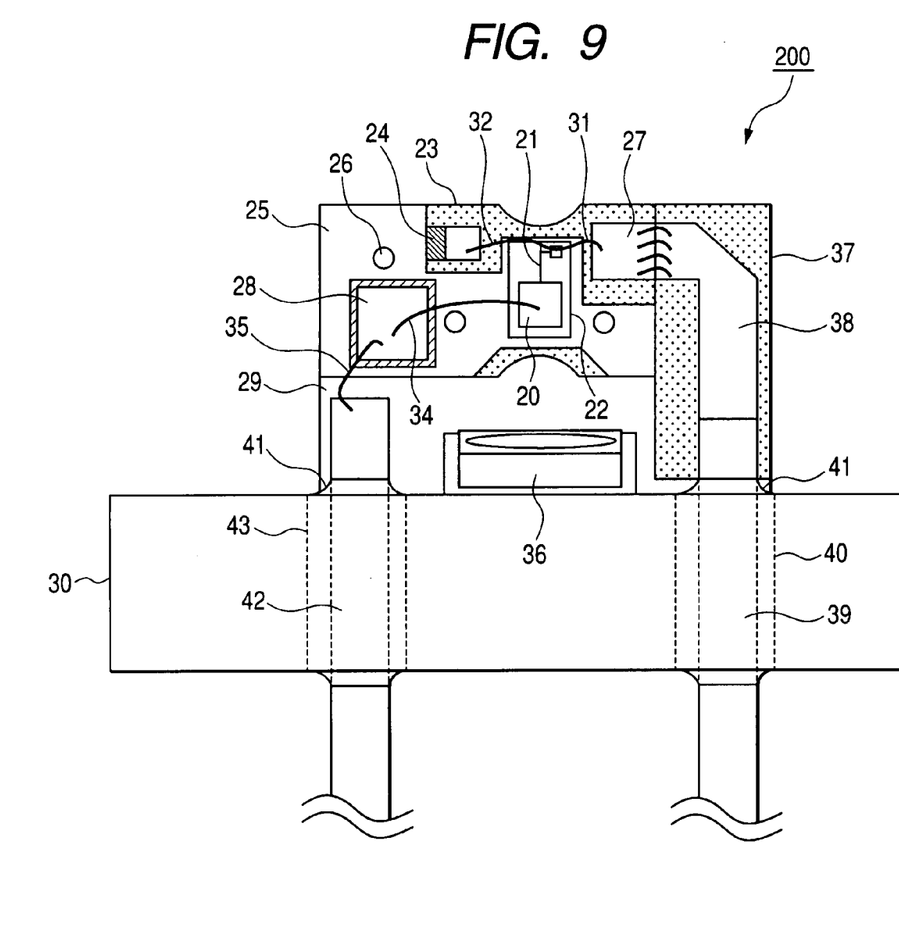
FIG. 9 is a structural view showing major sections of another optical transmission module according to a second embodiment of the present invention.
Figure 10:
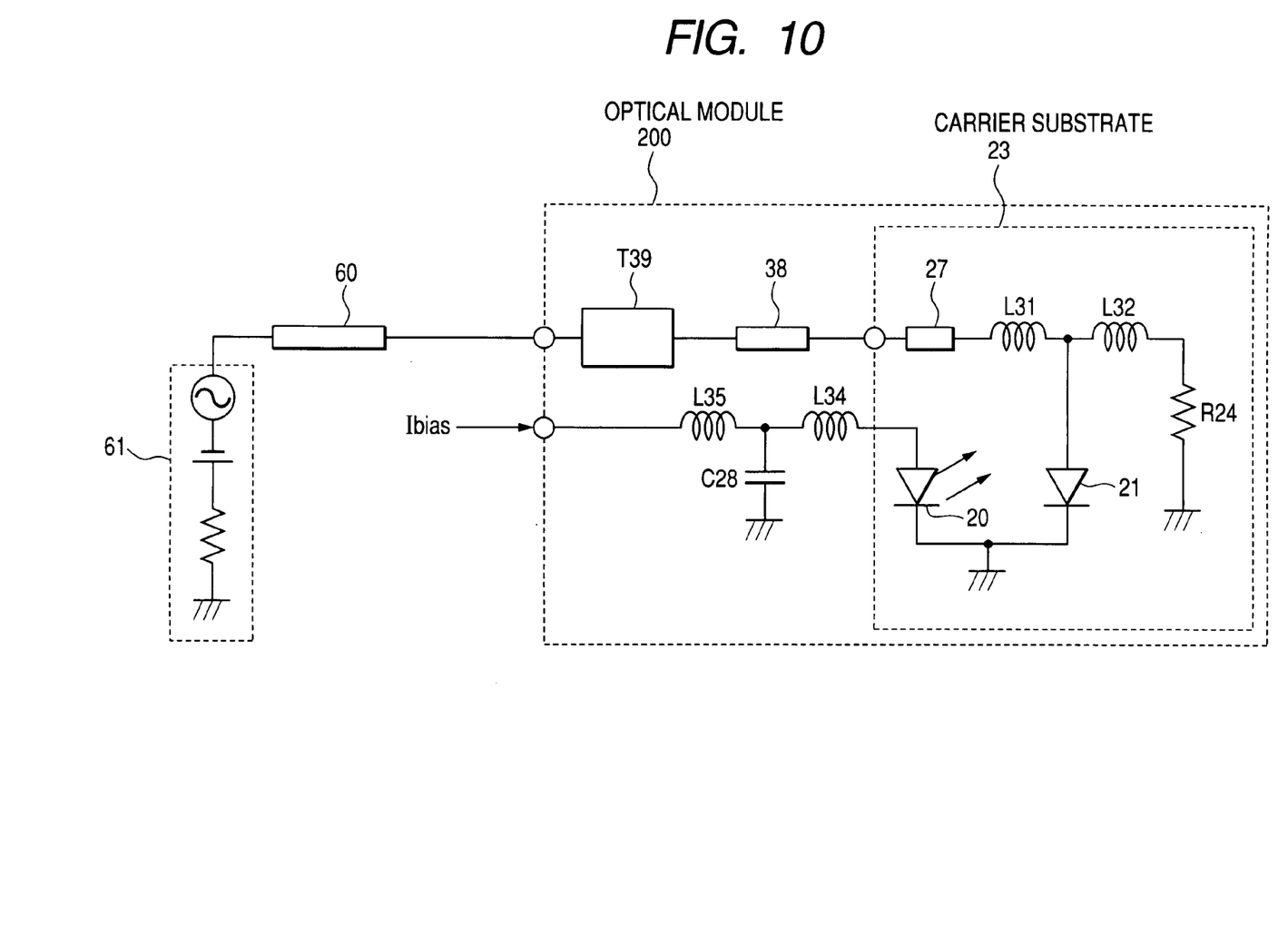
FIG. 10 is a main circuit diagram of the optical transmission module according to the second embodiment of the present invention.

A second embodiment of the present invention will be described below using FIGS. 9 and 10. FIG. 9 is a side view showing the major section of an optical transmission module according to the second embodiment of the present invention. FIG. 10 is a main circuit diagram of the optical transmission module according to the second embodiment of the present invention.

First, a configuration of the optical transmission module will be described using FIG. 9. The optical transmission module 200 uses a CAN type of package as its enclosure. Reference number 30 denotes a metallic stem of the enclosure 1, and 29 denotes a metallic mount for mounting the major section of the module. The metallic stem 30 has cylindrical lead pins 39, 42, which pass through cylindrical through-holes 40, 43, respectively, and are fixed to respective sealing glass members 41. A relay substrate 37 and a carrier substrate 23 are mounted on the metallic mount 29. A transmission line 38 is provided on the relay substrate 37. Patterns of a resistance element 24, a grounding metal 25, and an input transmission line 27 are provided on the surface of the carrier substrate 23. The grounding metal 25 connects to a reverse-side electrode of the carrier substrate 23 through VIA holes 26. A semiconductor chip 22 and a bypass capacitor 28 are also mounted on the carrier substrate 23. The semiconductor chip 22 is a modulator-integrated semiconductor laser chip having, on its surface, a semiconductor laser diode element 20 and an optical modulator element 21. The continuous laser light output from the semiconductor laser diode element 20 is passed through the optical modulator element 21 and then emitted to an optical fiber via a coupling lens not shown. The modulator element 21 modulates the continuous laser light into optical modulation signals using the 10-Gbits/s electrical modulation signals sent from an external driving IC. On the metallic stem 30 is provided a monitoring photodiode 36, which is fixed to a position where it can receive the light output from rear facet of the semiconductor laser diode element 20.

A first bonding wire 31 connects the input transmission line 27 with the optical modulator element 21. A second bonding wire 32 connects the optical modulator element 21 and the resistance element 24. The input transmission line 27 on the carrier substrate 23 and the transmission line 38 on the relay substrate 37 are connected by a ribbon wire or the like at low inductance. The transmission line 38 and the lead pin 39 are bonded to each other with an AuSn alloy or the like. In this way, an electrical signal input route from the lead pin 39 to the optical modulator element 21 is constructed. The semiconductor laser diode element 20 connects with the lead pin 42 via power-feeding bonding wires 34, 35, and supplies a DC current from the lead pin 42. The power-feeding bonding wires 34, 35 are connected to an electrode of the bypass capacitor 28.

The CAN-type package enclosure is, for example, a ϕ5.6-mm TO-56 type of enclosure. Using inexpensive iron as a material for both the metallic stem 30 and the metallic mount 29 is preferred for reducing costs. The relay substrate 37 and the carrier substrate 23 are constructed using a dielectric material such as alumina or aluminum nitride. Using highly heat-conductive aluminum nitride as a material for the carrier substrate 23 reduces the thermal resistance transmitted from the semiconductor chip 22 to the metallic mount 29, and is thus preferred for suppressing increases in element temperature. Also, the carrier substrate 23 may be constructed by laminating a dielectric substrate made of aluminum nitride or the like, and a metallic plate made of a copper-tungsten alloy or the like. Construction of the carrier substrate 23 in this way makes the substrate 23 suitable for further lowering the thermal resistance.

The resistance element 24 is constructed of a tantalum nitride film surface-treated by anodic oxidation, and is adjusted by laser trimming to obtain a resistance value of 50 Ω. The semiconductor chip 22 uses an "n"-type InP substrate, on the surface of which are formed both the semiconductor laser diode element 20 that is a distributed feedback laser diode (DFB-LD), and the optical modulator element 21 that is an electroabsorption modulator (EAM). Respective anodic electrodes of the semiconductor laser diode element 20 and the optical modulator element 21 are also provided on the chip surface. The first bonding wire 31 and the second bonding wire 32 may be linearly formed by interposing one wire therebetween with the anodic electrode of the optical modulator element 21 used as a relay point. In this case, the formation is preferred for reducing element capacity Cmod since the anodic electrode of the optical modulator element 21 can be minimized in terms of area. The reverse-side electrode of the chip is used as a cathodic electrode shared by the semiconductor laser diode element 20 and the optical modulator element 21. An output from the monitoring photodiode 36 is sent out through any other lead pin (not shown). For dimensional reduction, it is preferable that the bypass capacitor 28 be of the parallel flat-plate type constructed of a single-layer, highly dielectric substrate material.

Next, circuit composition will be described using FIG. 10. First, an electrical modulation signal that a driving IC 61 has output is input to the input transmission line 27 on the carrier substrate through an external transmission line 60, a coaxial line T39, and the transmission line 38 on the relay substrate 37. The coaxial line T39 includes the through-hole 40, the lead pin 39, and the appropriate sealing glass member 41. The transmission line 60 includes a transmission line formed on a printed substrate having the driving IC 61 mounted thereon, and a transmission line formed on a flexible substrate that connects the printed substrate with the lead pin 39. The transmission line 60 has a characteristic impedance of 50 Ω. The coaxial line T39 has a characteristic impedance of 30 Ω, and the transmission lines 38 and 27 both have a characteristic impedance of 50 Ω. Symbol R24 denotes a resistance value of the resistance element 24, and symbols L31, L32 denote inductance values of the first and second bonding wires 31, 32, respectively. The electrical modulation signal is input to an anode of the optical modulator element 21 via the above circuit elements. A cathode of the optical modulator element 21 is electrically grounded. A forward DC current Ibias is supplied as a bias current from an external circuit element to the semiconductor laser diode element 20, which then outputs laser light. Since an inverse bias is usually applied to the electroabsorption modulator to operate it, the present embodiment uses both a −5.2-V negative power supply, and a +3.3-V positive power supply for the laser element.

In the present embodiment, for example, Cmod is 0.5 pF, L31 is 0.29 nH, L32 is 0.75 nH, and R24 is 50 Ω. Also, the total electrical length of the input transmission line 27 and transmission line 38 (both 50 Ω in characteristic impedance) at a 10-GHz frequency is taken as 35.0 degrees, and an electrical length of the coaxial line T39 (30 Ω in characteristic impedance), as 31.3 degrees.

According to the present second embodiment, optical output characteristics improvement effects similar to those of the above first embodiment can be obtained. Additionally, an optical transmission module that is further preferred for reducing dimensions and for reducing costs can be realized by using the CAN-type package enclosure.

In the above second embodiment the coaxial line T39 formed up of the through-hole 40, the lead pin 39, and the appropriate sealing glass member 41 has a characteristic impedance of 30 Ω. However, this value may be changed in a range of, for example, 20–30 Ω, depending on particular shapes of these members and on the type of glass material selected for sealing. Also, while it is assumed that the resistance element 24 has a resistance value of 50 Ω, this value may be changed in a range of, for example, 40–60 Ω, depending on factors such as adaptability to the driving IC mounted in an optical transmitter.

In addition, the diode polarity of the optical modulator element 21 in the circuit composition (FIG. 10) of the present second embodiment may be reversed. This makes it possible, even with a positive power supply, to apply an inverse bias to the optical modulator element 21, and thus produces a new advantageous effect that an optical transmission module capable of being operated only on positive power such as +5.0-V power can be realized.

Figure 11:
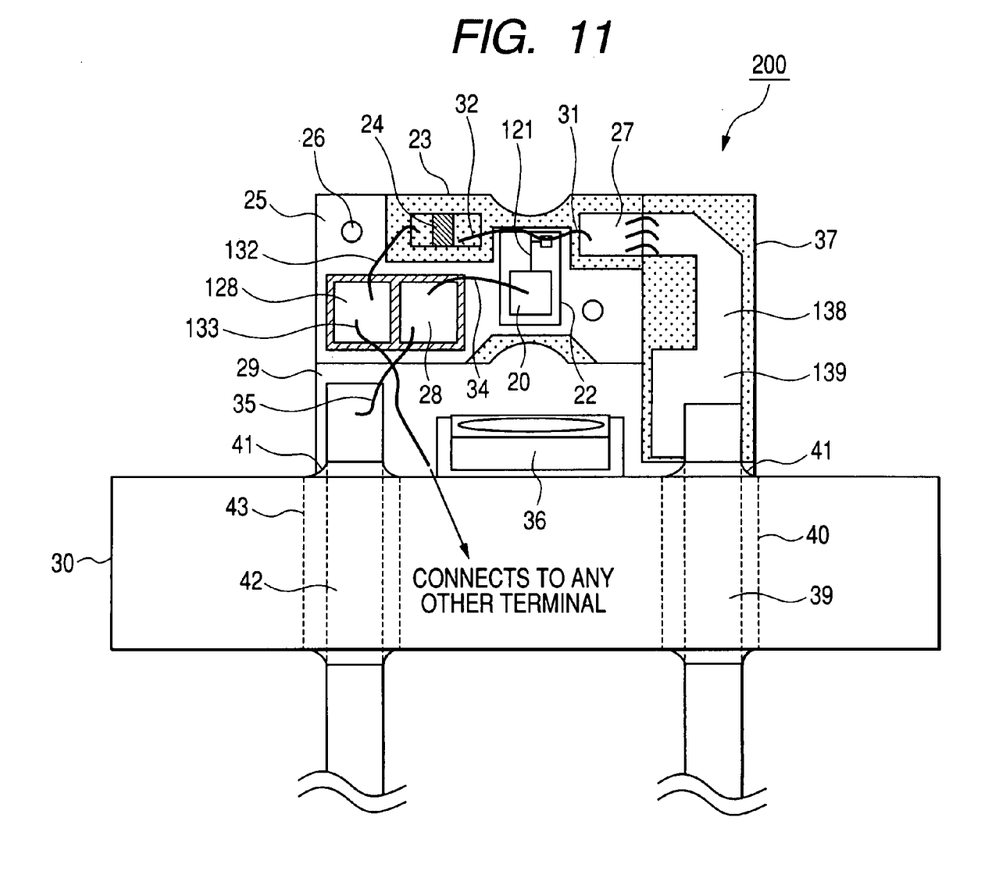
FIG. 11 is a structural view showing major sections of yet another optical transmission module according to a third embodiment of the present invention.
Figure 12:
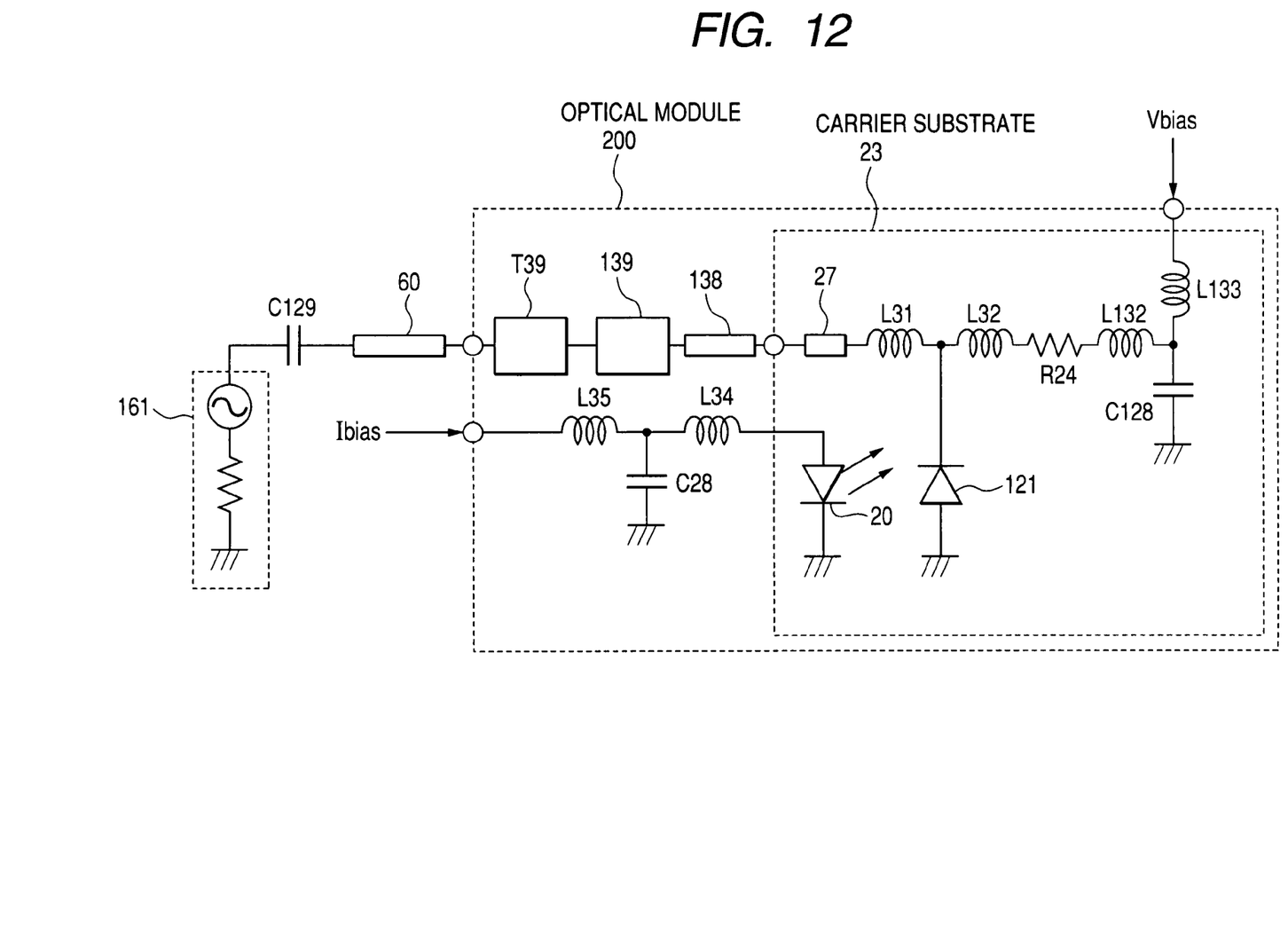
FIG. 12 is a main circuit diagram of the optical transmission module according to the third embodiment of the present invention.

A third embodiment of the present invention will be described below using FIGS. 11 and 12. FIG. 11 is a structural view showing the major section of an optical transmission module according to the third embodiment of the present invention. FIG. 12 is a main circuit diagram of the optical transmission module according to the third embodiment of the present invention. One of the main differences from the second embodiment exists in that the microstrip line type of transmission line provided on the relay substrate 37 includes a transmission line 138 having a characteristic impedance of 50 Ω, and a transmission line 139 having a characteristic impedance of 30 Ω. Also, as shown in FIG. 12, an optical modulator element 121 with reversed diode characteristics is used. A positive voltage is applied from bias terminal Vbias (not shown) through a bias voltage application bonding wire 133, a third bonding wire 132, a resistance element 24, and a second bonding wire 32, to a cathode terminal. Reference number 128 denotes a bypass capacitor, through which the bonding wire 132 is electrically grounded at one end in a radiofrequency-like fashion. Symbols L132, L133 in FIG. 12 denote inductances of the bonding wires 132, 133, respectively. Symbol C128 denotes a capacity of the bypass capacitor 128, and C129 a capacity of a DC block capacitor inserted in series into an input signal route. Since a bias voltage can be applied from an external circuit element to the optical modulator element 121, a driving IC 161 needs only to supply radiofrequency driving voltage signals. This is preferred both for making a supply voltage of the driving IC positive and for reducing the voltage.

The optical module 200 of the present embodiment has, for example, a Cmod value of 0.5 pF, an L31 value of 0.29 nH, an L32+L132 value of 0.75 nH, and an R24 value of 50 Ω. Also, total electrical length of an input transmission line 27 and transmission line 138 (both 50 Ω in characteristic impedance) at a 10-GHz frequency is taken as 35.0 degrees, and the total electrical length of a coaxial line T39 and transmission line 139 (30 Ω in characteristic impedance), as 31.3 degrees.

According to the present third embodiment, optical output characteristics improvement effects similar to those of the above first embodiment can be obtained. Additionally, an optical transmission module that is further preferred for reducing dimensions and for reducing costs can be realized by using a CAN-type package enclosure. Furthermore, the electrical length of the 30-Ω transmission line which includes the coaxial line T39 and the transmission line 139, can be changed by modifying only the wiring patterns formed on the relay substrate 37. This produces the advantageous effect that optical transmission modules associated with a plurality of optical modulator elements each having a different element capacity can be realized using one CAN-type package enclosure.

The present third embodiment is an example of an optical module whose optical modulator element is reversed in diode polarity. This makes application of an inverse bias to the optical modulator element 121, even with a positive power supply. There is the effect, therefore, that an optical transmission module capable of being operated only on positive power such as +3.3-V power can be realized.

The third embodiment is adapted to apply a bias voltage from bias terminal Vbias to the optical modulator element 121. The application of a bias voltage in this way, however, can be omitted by, in FIG. 11, deleting the bias voltage application bonding wire 133 and deleting one lead pin from the CAN-type enclosure. In this case, a bias voltage application terminal and a choke circuit need to be added to the mounting substrate for the driving IC in order to enable a bias voltage to be applied from the lead pin 39. The omission of the above, however, is preferred for dimensional reduction of the optical transmission module, since one lead pin of the CAN-type enclosure can be deleted.

According to the present embodiment, it is possible to realize an optical transmission module structure that: makes it possible to simultaneously achieve both the optimization of small-signal passage characteristics (S21) for improved output waveforms of an optical modulator, and reduction in its small-signal reflection coefficient (S11), and does not easily deteriorate waveform quality even in the event of an output impedance mismatch in a driving IC.

We claim:

1. An optical module comprising:
a first transmission line that transmits an electrical signal to a second transmission line;
an optical modulator element connected to said second transmission line in order to modulate laser light by use of the electrical signal; and
a termination resistance element connected at one end thereof to said second transmission line and at the other end to said optical modulator element;
wherein:
a difference between a resistance value of said termination resistance element and a characteristic impedance of said second transmission line is equal to or less than 10 Ω; and
a characteristic impedance of said first transmission line is at least 20 Ω smaller than the characteristic impedance of said second transmission line.

2. An optical module comprising:
a first transmission line that transmits an electrical signal to a second transmission line;
an optical modulator element connected to said second transmission line in order to modulate laser light by use of the electrical signal; and
a termination resistance element connected at one end thereof to said second transmission line and at the other end to said optical modulator element;
wherein:
said termination resistance element has a resistance value ranging from 40 to 60 Ω;
said second transmission line has a characteristic impedance ranging from 40 to 60 Ω;
said second transmission line at 10 GHz has an electrical length ranging from 10 to 120 degrees;
said first transmission line has a characteristic impedance ranging from 20 to 30 Ω; and
said first transmission line at 10 GHz has an electrical length ranging from 15 to 120 degrees.

3. The optical module according to claim 2, wherein a total electrical length of said first transmission line and said second transmission line ranges from 25 to 120 degrees.

4. The optical module according to claim 1, wherein said second transmission line includes a microstrip line.

5. The optical module according to claim 2, wherein said second transmission line includes a microstrip line.

6. The optical module according to claim 1, further comprising a CAN type of package enclosure;
wherein said second transmission line includes a coaxial line formed by said enclosure.

7. The optical module according to claim 2, further comprising a CAN type of package enclosure;
wherein said second transmission line includes a coaxial line formed by said enclosure.

8. The optical module according to claim 1, further comprising a CAN type of package enclosure;
wherein said second transmission line includes a coaxial line formed by said enclosure, and a microstrip line.

9. The optical module according to claim 2, further comprising a CAN type of package enclosure;
wherein said second transmission line includes a coaxial line formed by said enclosure, and a microstrip line.

10. The optical module according to claim 6, wherein a bias voltage input lead pin to said optical modulator element, and a radiofrequency signal input lead pin are provided separately from each other.

11. The optical module according to claim 7, wherein a bias voltage input lead pin to said optical modulator element, and a radiofrequency signal input lead pin are provided separately from each other.

12. The optical module according to claim 8, wherein a bias voltage input lead pin to said optical modulator element, and a radiofrequency signal input lead pin are provided separately from each other.

13. The optical module according to claim 9, wherein a bias voltage input lead pin to said optical modulator element, and a radiofrequency signal input lead pin are provided separately from each other.

14. An optical module comprising:
a first transmission line that transmits an electrical signal to a second transmission line;
an optical modulator element connecting to said second transmission line in order to modulate laser light by use of the electrical signal; and
a termination resistance element connecting to said second transmission line and said optical modulator element;
wherein:
a characteristic impedance of said first transmission line is at least 20 Ω smaller than a characteristic impedance of said second transmission line; and
an S11 characteristic value at 7.5 GHz is equal to or less than −15 dB.

15. The optical module according to claim 14, wherein the S11 characteristic value at 7.5 GHz is equal to or less than −20 dB.

* * * * *

UNITED STATES PATENT AND TRADEMARK OFFICE
CERTIFICATE OF CORRECTION

PATENT NO. : 7,011,458 B2
APPLICATION NO. : 11/131177
DATED : March 14, 2006
INVENTOR(S) : O. Kagaya et al.

It is certified that error appears in the above-identified patent and that said Letters Patent is hereby corrected as shown below:

IN COLUMN 12, LINES 12-31

Please amend claims 4-9 in column 12, lines 12-31 as follows.

4. The optical module according to claim 1, wherein said ~~second~~ first transmission line includes a microstrip line.
5. The optical module according to claim 2, wherein said ~~second~~ first transmission line includes a microstrip line.
6. The optical module according to claim 1, further comprising a CAN type of package enclosure; wherein said ~~second~~ first transmission line includes a coaxial line formed by said enclosure.
7. The optical module according to claim 2, further comprising a CAN type of package enclosure; wherein said ~~second~~ first transmission line includes a coaxial line formed by said enclosure.
8. The optical module according to claim 1, further comprising a CAN type of package enclosure; wherein said ~~second~~ first transmission line includes a coaxial line formed by said enclosure, and a microstrip line.
9. The optical module according to claim 2, further comprising a CAN type of package enclosure; wherein said ~~second~~ first transmission line includes a coaxial line formed by said enclosure, and a microstrip line.

Signed and Sealed this

Ninth Day of March, 2010

David J. Kappos
*Director of the United States Patent and Trademark Office*